United States Patent [19]
Ventzek et al.

[11] Patent Number: 6,165,567
[45] Date of Patent: Dec. 26, 2000

[54] PROCESS OF FORMING A SEMICONDUCTOR DEVICE

[75] Inventors: Peter Lowell George Ventzek; Daniel G. Coronell; Michael J. Hartig; John C. Arnold, all of Austin, Tex.

[73] Assignee: Motorola, Inc., Schumburg, Ill.

[21] Appl. No.: 09/290,385

[22] Filed: Apr. 12, 1999

[51] Int. Cl.$^7$ .............................. C23C 14/34; C23C 14/48
[52] U.S. Cl. ............... 427/576; 204/192.11; 204/192.25; 204/192.12; 204/192.1; 204/192.17; 204/192.16; 204/298.12; 204/298.11; 204/298.06; 204/298.02; 427/569; 427/580; 427/123; 427/124; 427/126.1; 427/526; 427/527; 427/531; 438/758; 438/584; 438/579
[58] Field of Search .......................... 204/192.11, 192.25, 204/192.12, 298.06, 192.1, 192.17, 192.16, 192.22, 298.12, 298.11, 298.04, 298.02; 427/569, 576, 580, 123, 124, 126.1, 526, 527, 531; 438/961, 758, 584, 679

[56] References Cited

U.S. PATENT DOCUMENTS

| | | |
|---|---|---|
| 4,500,409 | 2/1985 | Boys et al. . |
| 4,564,435 | 1/1986 | Wickersham . |
| 4,606,806 | 8/1986 | Helmer . |
| 4,627,904 | 12/1986 | Mintz . |
| 4,761,218 | 8/1988 | Boys . |
| 4,842,703 | 6/1989 | Class et al. .................. 204/198.18 |
| 5,061,360 | 10/1991 | Clarke .......................... 204/298.18 |
| 5,135,634 | 8/1992 | Clarke .......................... 204/298.06 |
| 5,194,131 | 3/1993 | Anderson ...................... 204/192.12 |
| 5,302,266 | 4/1994 | Grabarz et al. ................ 204/192.12 |
| 5,314,597 | 5/1994 | Harra ............................ 204/192.13 |
| 5,340,459 | 8/1994 | Takehara ...................... 204/298.07 |
| 5,417,833 | 5/1995 | Harra et al. ..................... 204/298.2 |
| 5,593,551 | 1/1997 | Lai ................................ 204/192.12 |
| 5,683,548 | 11/1997 | Hartig et al. .................... 156/643.1 |
| 5,707,498 | 1/1998 | Ngan ............................ 204/192.12 |
| 5,711,812 | 1/1998 | Chapek et al. .................. 118/723 E |
| 5,800,688 | 9/1998 | Lantsman et al. ............ 204/298.11 |
| 5,830,272 | 11/1998 | Begin et al. ....................... 118/500 |
| 5,902,461 | 5/1999 | Xu et al. ....................... 204/192.12 |
| 5,968,327 | 10/1999 | Kobayashi et al. ............ 204/298.11 |
| 5,976,327 | 11/1999 | Tanaka .......................... 204/192.15 |

FOREIGN PATENT DOCUMENTS

| | | |
|---|---|---|
| 0874065A1 | 10/1998 | European Pat. Off. . |
| 60-181268 | 9/1985 | Japan . |
| 5-263234 | 10/1996 | Japan . |

OTHER PUBLICATIONS

Hajzak, "Practical Techniques for Improving Sputtered Film Quality," J. Vacuum Sci, Technol., 7(1), pp. 224–227, Jan. 1970.

Rossnagel, "Directional and ionized physical vapor deposition for microelectronics applications," Review Article, American Vacuum Society, pp. 2585–2607 (1998) (month unknown).

Yamada et al., "Model for a large area multi-frequency multiplanar coil inductively coupled plasma source," Journal of Vacuum Science and Technology A, American Institute of Physics, JVST A Second Series, vol. 14, No. 5, pp. 2859–2870 Sep./Oct., 1996.

Ventzek et al., "Simulations of real-time control of two-dimensional features in inductively coupled plasma sources for etching applications," American Vacuum Society, pp. 2456–2463 Sep./Oct., 1995.

"Physics and Chemistry of Protective Coatings," American Institute of Physics, Conference Proceedings No. 149, American Vacuum Society Series 2, pp. 62–78 (1986) (month unknown).

*Primary Examiner*—Alan Diamond

[57] ABSTRACT

A film is formed over a substrate using a physical vapor deposition method. When using ionized metal plasma physical vapor deposition, the deposition chamber configuration or operating parameters are adjusted to achieve the desired film characteristics. If the film is to be substantially uniform in thickness across a substrate, the deposition species density is made higher at locations away from the center of the substrate.

13 Claims, 7 Drawing Sheets

PROCESS OF FORMING A SEMICONDUCTOR DEVICE

FIELD OF THE INVENTION

This invention relates in general to processes for forming semiconductor devices, and more particularly, to processes for forming semiconductor devices having a deposited layer.

RELATED ART

Deposited films are used in forming semiconductor devices. Forming films within high aspect ratio openings is difficult. Ionized metal plasma physical vapor deposition (IMP-PVD) is used to form films within the high aspect ratio openings. As deposited, the films need to be continuous along all surfaces of the openings. FIG. 1 includes an illustration of a cross-sectional view of a portion of an IMP-PVD chamber 10. More specifically, the IMP-PVD chamber 10 includes a substrate 12 that is to be deposited with a material from target 14. A magnet array 16 lies outside the chamber 10, and, an inductive coil 18 lies within the chamber 10 and is powered by a power supply (not shown). When generating species to be deposited across the substrate 12, deposition species generation region 11, which in essence, is a "cloud" of the ionized species, is formed over the substrate 12. The purpose of this cloud is to provide a flux of directed, energetic ions to the surface, where they promote deposited film conformality by traveling deep into the openings before sticking to the walls and by redistributing previously-deposited material within the openings through sputtering.

As shown in FIG. 1, this region 11 has a density of ionized species that is generally higher in the center of the reactor compared to regions farther from the center. When depositing a film onto the substrate 12, the thickness near the center of the substrate 12 is thicker than near the edge. Skilled artisans would try to make region 11 more uniform in the region inside the coil 18.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

A film is formed over a substrate using a physical vapor deposition method. When using ionized metal plasma physical vapor deposition, the deposition chamber configuration or operating parameters are adjusted to achieve the desired film characteristics. If the film is to be substantially uniform in thickness across a substrate, the deposition species density is made higher at locations away from the center of the substrate. The present invention is defined by the claims and is better understood after the description of embodiments that follow.

Figure 1:
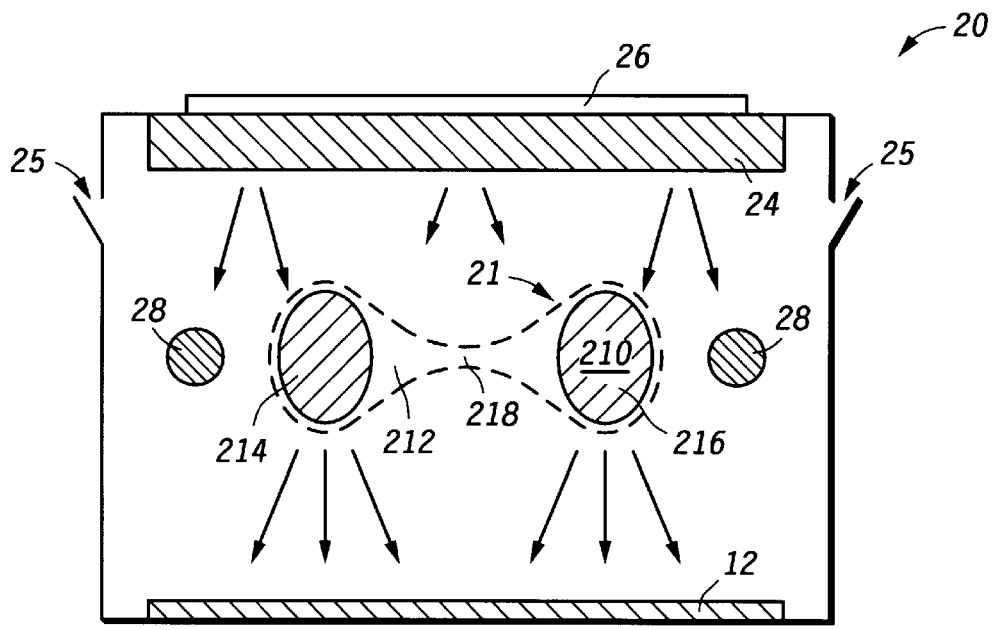
FIG. 1 includes an illustration of a cross-sectional view of a portion of an IMP-PVD chamber (prior art)
Figure 2:
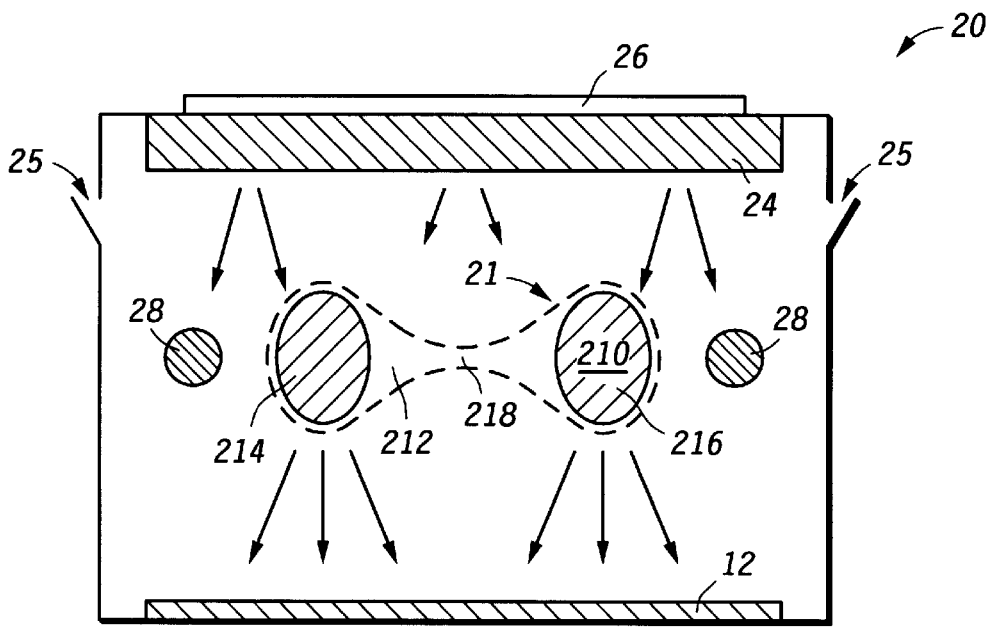
FIGS. 2–9 includes illustrations of cross-sectional and perspective views of portions of IMP-PVD chambers in accordance with embodiments of the present invention.

FIG. 2 includes an illustration of a portion of a cross-sectional view of a chamber 20 for an IMP-PVD system. The chamber includes a target 24, gas ports 25, an external magnet array 26, an internal inductive coil 28, and substrate 12. More particularly, referring to the chamber 20 shown in FIG. 2, instead of having relatively uniform deposition species generation region 11 as seen in FIG. 1, the deposition species generation region 21 has a shape illustrated as shape 212 or shape 210 when viewed in cross section as shown in FIG. 2. For the dumbbell shape 212, the species generation region has different densities of the species being deposited. One annular region includes locations 214 and 216, which are closer to the edge of the chamber 20 near inductive coil 28. The density of the species within that annular region is higher than the density of the species at another region, which includes center 218, which lies inside the annular region. The annular region (including locations 214 and 216) laterally surrounds that other region.

The film deposited onto the semiconductor device substrate 12 is substantially uniform in thickness, conformal, and continuous on all surfaces of openings within the substrate. As used herein, a semiconductor device substrate includes a monocrystalline semiconductor wafer, a semiconductor-on-insulator wafer, or any other substrate used for forming semiconductor devices. Contrary to conventional wisdom, a non-uniform species generation region 21 is formed to achieve a more uniform deposition thickness. Alternatively, the species generation region 21 can be tailored to deposit the film such that it is actually thicker near the edges of the substrate 12. Also, the chamber as illustrated in FIG. 2 allows for more process margin in forming the film. The IMP-PVD chamber may or may not use a magnetron.

Figure 3:
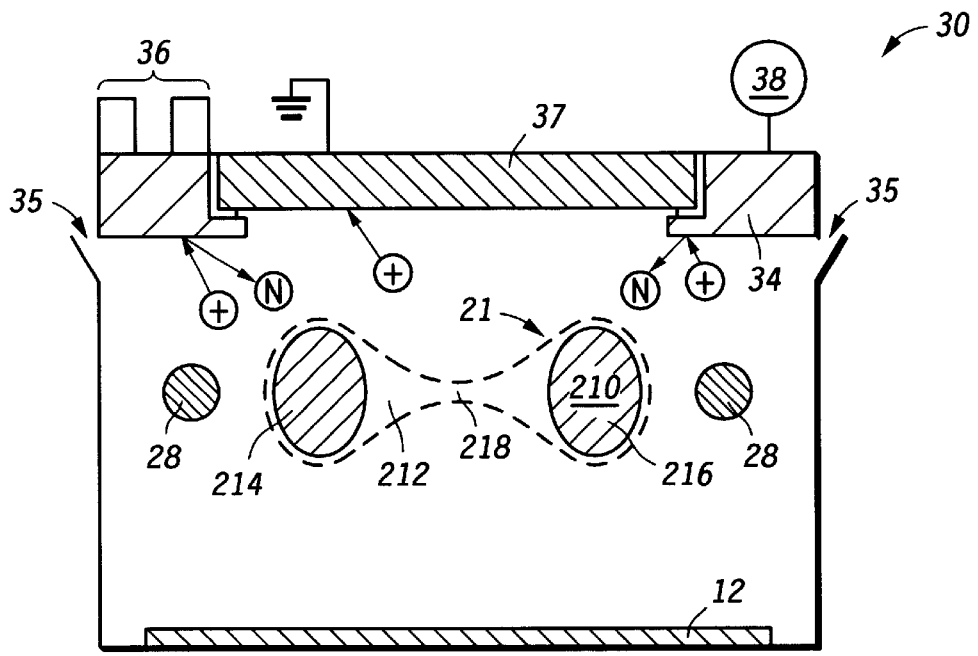
Figure 4:
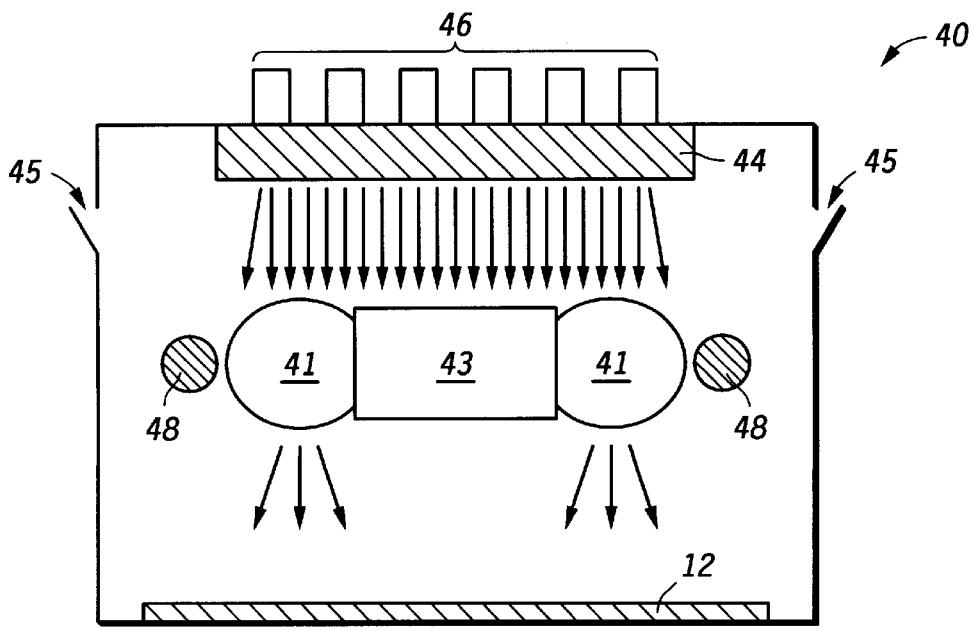
Figure 5:
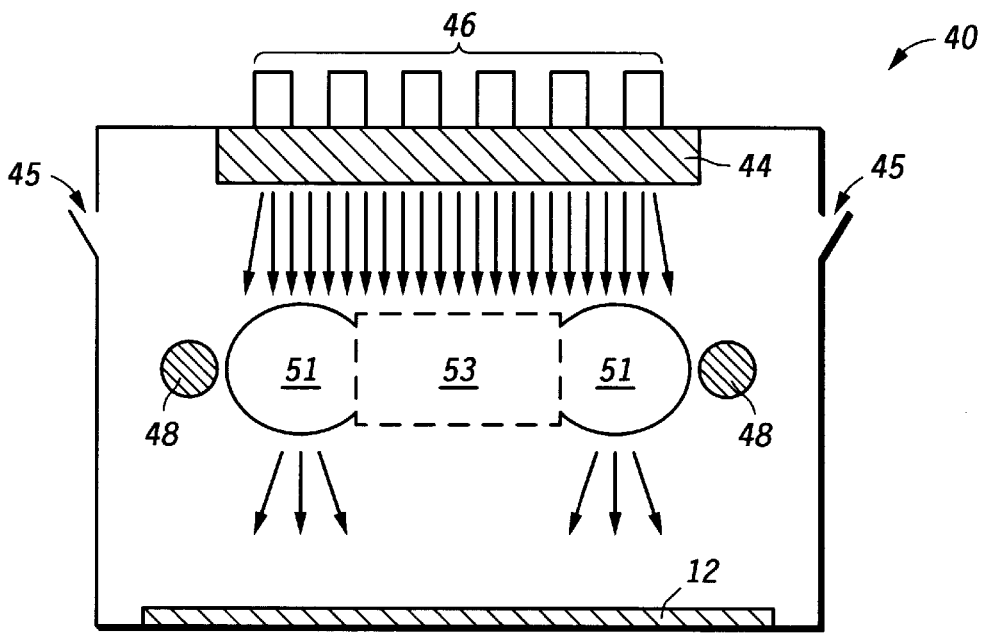

There are a number of ways of modifying the equipment or its use to achieve the dumbbell-shaped 210 or toroidal-shaped 212 deposition species generation region 21 as illustrated in FIG. 2. For example, in FIG. 3 instead of using a conventional disk target, an annular target 34 can be used. The target 34 has an exposed surface facing the substrate 12. The exposed surface of the target 34 is substantially parallel to the primary surface of the substrate 12. Magnet array 36 is located above the target 34 outside the chamber. Direct current (DC) or radio frequency (RF) power is provided to the target 34 by power source 38. DC powered targets are typically used to deposit metal films, and RF powered targets are typically used to deposit dielectric films. Chamber 30 also includes gas ports 35 and inductive coil 28. In addition, the roof shield 37 is typically grounded so that it is not a sputtering surface ("target"). Unlike the target 14 illustrated in FIG. 1, the target 34 is not present in the center of the chamber. Therefore, not as much of the deposited species are generated near the center of the chamber. More of the species are generated near the edge of the target to create the region as illustrated in FIG. 2. An extension of the embodiment in FIG. 3 is to use multiple concentric and electrically isolated targets to effect process control (uniformity) or composition control if an alloy film is deposited. FIGS. 4 and 5 illustrate still other equipment configurations that help to increase the species generation region toward the edges of the chamber. As illustrated in FIG. 4, a physical object 43, which can include an insulator or a metal, is placed near the center of the chamber 40. This physically prevents the species generation region 41 from forming where that physical object 43 lies. FIG. 4 also includes the substrate 12 and the target 44. The target 44 may be similar to one illustrated in FIGS. 1–3. The chamber 40 for the IMP-PVD system further includes magnet array 46, gas ports 45, and an inductive coil 48.

FIG. 5 includes an alternative embodiment. Instead of using a physical object 43, a Faraday cage 53 can be located in the chamber 51 where the physical object 43 is shown in FIG. 4. The deposited species generation region 51 in FIG. 5 is similar to the shape of region 41 in FIG. 4. The Faraday cage 53 can be grounded or allowed to electrically float.

Figure 6:
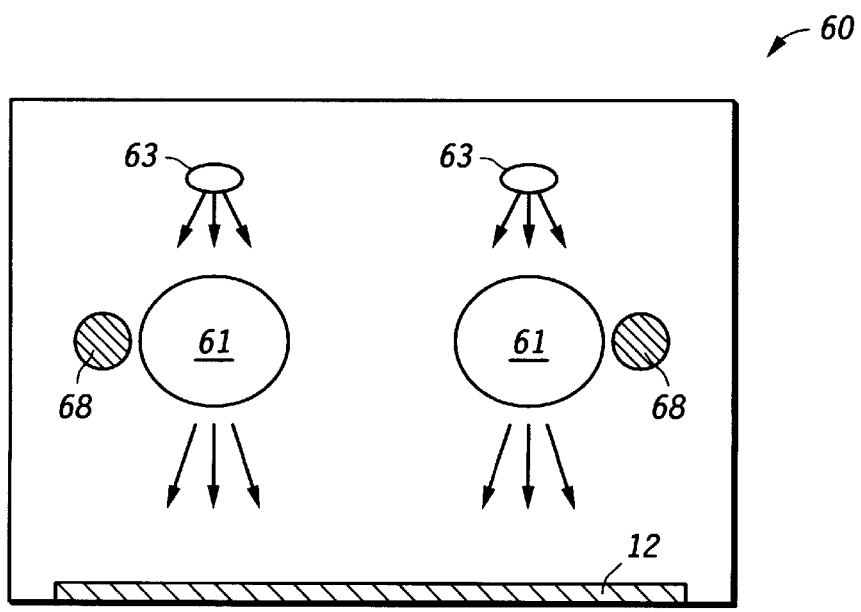

In still another embodiment, an annular gas distribution ring 63 can be used in the chamber 60 as shown in FIG. 6. The gas ports seen in earlier embodiments are not needed or used during deposition, although they could be present and used for flushing or purging the chamber. The gas ring 63 directs the gas (including the species to be deposited) near the inductive coils 68 to form the deposition species generation region 61, which also has an annular shape. This allows the precursor to flow into the chamber 60 but limits its introduction until closer to the electromagnetic field generated by inductive coil 68, as opposed to closer to the chamber edge relative to the interior. Placing a pre-cursor source near the chamber edge, where the species depletion rate is higher, results in a more uniform flux of pre-cursor to the substrate.

Figure 7:
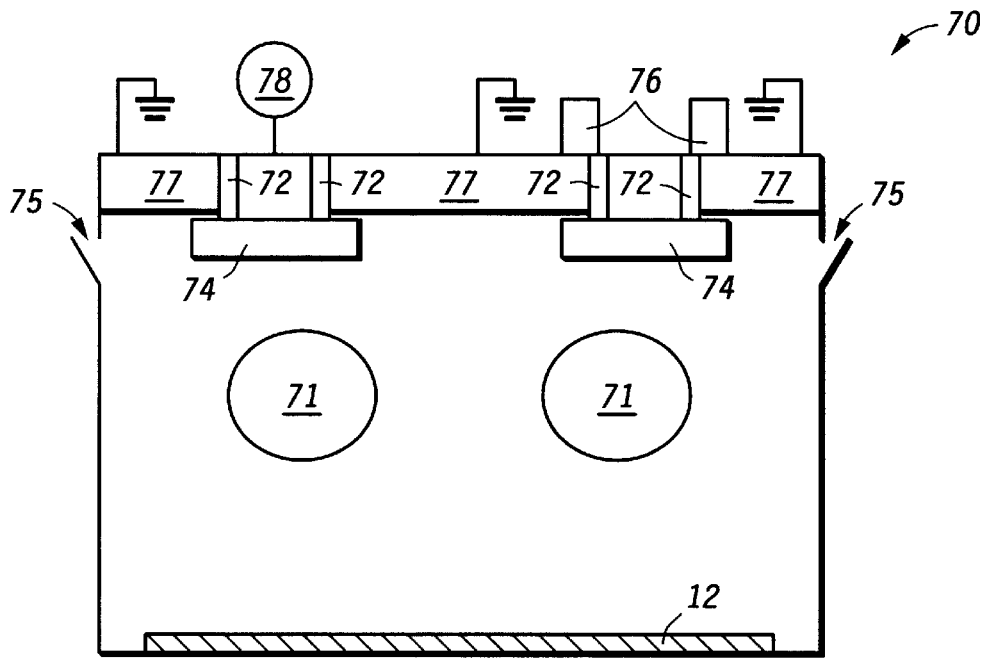

In FIG. 7, the inductive coil is integrated into the target 74 that is located near the top of the chamber 70. A separate feed through is used for applying DC and RF power 78 to the target 74. The DC power is used to sputter the coil-target and the RF power is used to ionize the species emitted from the coil-target. A magnet array 76 may lie outside the chamber but adjacent to the target. Because the inductive coil is integrated into the target 74, the species generation region 71 remains near the edge of the chamber 70 instead of closer to the center. The roof shield 77 of chamber 70 is grounded to reduce the likelihood of depositing material from the roof shield 77. The chamber 70 includes gas ports 75.

Figure 8:
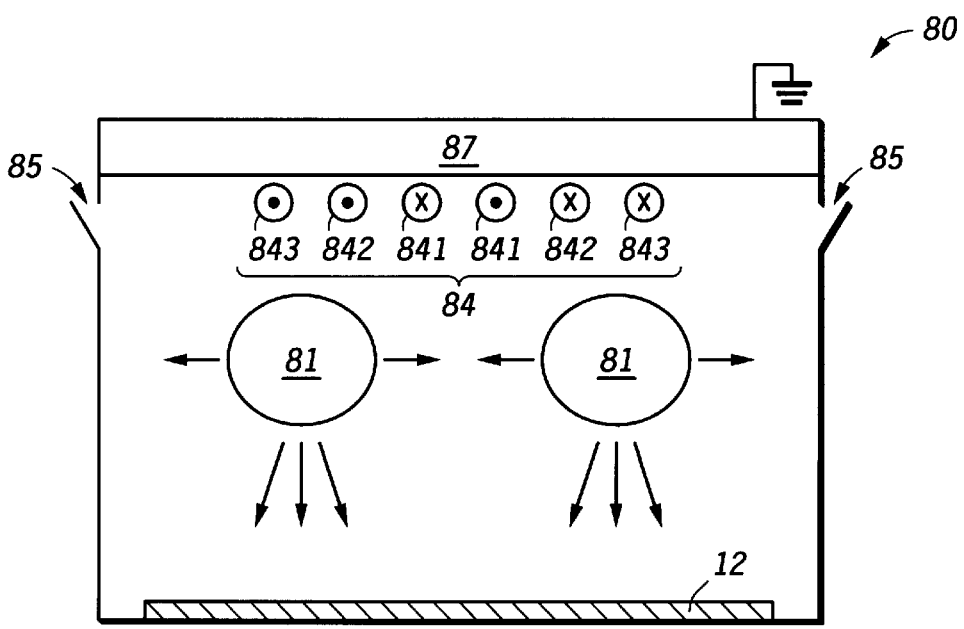

In another embodiment, the inductive coil is integrated into the target 84 and replaces the separate inductive coil with a series of concentric coils 841–843 as shown in FIG. 8. In the embodiment of FIG. 8, RF is supplied independently to each of the concentric coils 841–843 or to pairs or groups of coils when there are three or more. More specifically, since species generation needs to be relatively smaller near the center of the chamber, destructive interference between the innermost coil 841 and its immediately adjacent inductive coil 842 can be used to limit the electromagnetic fields near the chamber center. This can be achieved by using approximately the same frequency but different phase of power to inductive coils 841 and 842. However, the middle inductive coil 842 and the outermost inductive coil 843 can be tuned such that they have constructive interference, as opposed to destructive interference, producing higher electromagnetic fields near the periphery of the chamber. This can be achieved by using approximately the same frequency and phase of power to inductive coils 842 and 843.

In an alternative embodiment, the densest portion of the species generation region 81 can raster between the middle and outermost inductive coils 842 and 843 and as shown by the arrows in FIG. 8. This is accomplished by operating the three inductive coils 841, 842 and 843 at a set of frequencies, amplitudes, and phases such that: 1) there is destructive interference in the region between the chamber center and coil 841, and local regions of constructive interference in the region between coils 842 and 843, and 2) the locations of the regions of interference vary in a periodic fashion over time.

A means of accomplishing this would be to operate coils 842 and 843 at constant amplitude but different frequencies. If the destructive interference between the innermost and middle inductive coils 841 and 842 is to be maintained, the innermost and middle inductive coils 841 and 842 need to be tuned such that they operate at the same frequency but are out of phase by approximately 180 degrees (shown by current direction "×" and "●" (dot) in the coils). The current may flow clockwise around the inner inductive coil 841 and counterclockwise around the middle and outer inductive coils 842 and 843 or vice versa. If only a limited amount of species is to be formed, then the two inductive coils 841 and 842 do not necessarily need to be 180 degrees out of phase but still would be tuned to be somewhat out of phase (e.g., greater than approximately 90 degrees out of phase). A similar rastering motion of the ion generation region can be maintained by operating the coils at the same frequency and phase but by pulsing the RF power to the coils at different rates.

Figure 9:
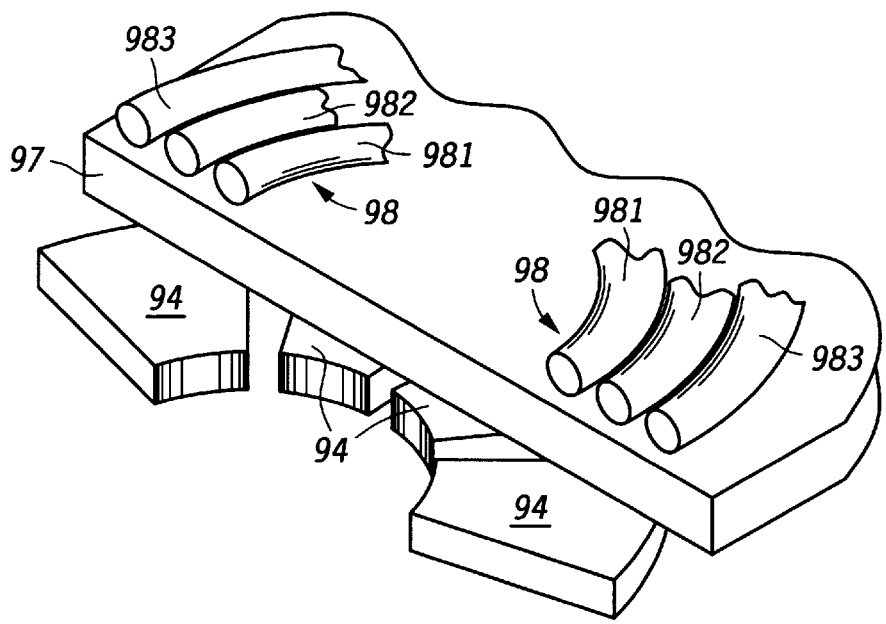

In still a further embodiment, a segmented target 94 could be used as shown in FIG. 9. With the segmented target 94, each of the segments is discontinuous from the other segments so that no current can flow in a circle around the region. The segmented target is playing the role of a Faraday shield. The segments are located within the chamber and possess a geometry such that they do not interfere with the electromagnetic fields generated in the plasma adjacent to the segments by the external set of inductive coils 98, which includes inductive coils 981, 982, and 983. These segments are typically put at a DC bias inserted from outside the chamber. The perspective view seen in FIG. 9 illustrates only a portion of the chamber including the target 94, roof shield 97 of the chamber, and the set of coils 98. Again, in this embodiment, placement of the coils outside the chamber helps to reduce the amount of material other than the target that will be sputtered. In other words, the coils themselves are not a source material for the deposited film.

Figure 10:
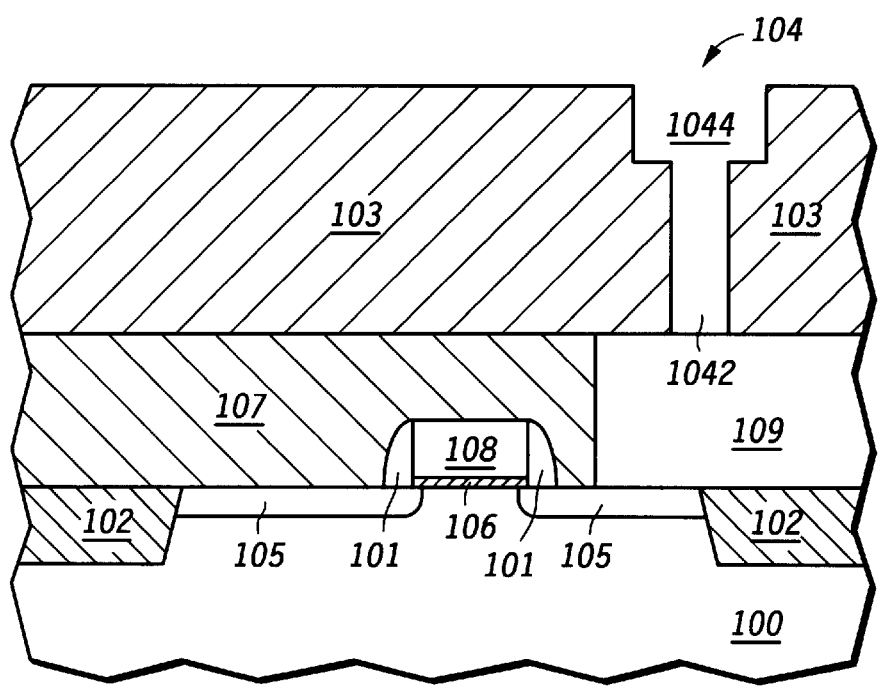
FIGS. 10–14 includes an illustration of a cross-sectional view of a portion of a semiconductor device substrate during a process sequence.

The use of the equipment is better understood when described in relation to forming a semiconductor device. FIG. 10 includes an illustration of a cross-sectional view of a portion of a semiconductor device substrate 100. More specifically, the semiconductor device substrate 100 includes field isolation regions 102 and doped regions 105. A gate dielectric layer 106 and a gate electrode 108 overlie the primary surface of the substrate 100. Spacers 101 are adjacent to the gate electrode 108. A first interlevel dielectric (ILD) layer 107 is formed over the primary surface of the substrate 100 and the gate electrode 108. An opening is formed within the first ILD layer 107, and a conductive plug 109 is formed within the opening. In this particular embodiment, conductive plug 109 is a local interconnect used to electrically connect one of the doped regions 105 to another component (not shown) of the semiconductor device. A second ILD layer 103 is formed over the primary surface of the first ILD layer 107 and the conductive plug 109. The second ILD layer 103 typically includes one or more films of insulators. The second ILD layer 103 is then patterned to form the dual inlaid opening 104 that includes a via portion 1042 and an interconnect trench 1044.

A film 112 is then formed over the second ILD layer 103 and within the opening 104. This film 112 is formed using any one of the prior reactors previously described with respect to FIGS. 2–9. In this specific non-limiting example, the configuration as illustrated in FIG. 3 including the annular target 34 is used. The target(s) are powered in a range of approximately 1–2 watts DC per square centimeter of target area. The source of ionization should be powered in a range of approximately 0.3–0.6 Watts per cubic centimeter of chamber volume. RF power may be applied to a substrate to ensure that it has a negative bias sufficient to result in ions from the plasma entering openings on the substrate with sufficient energy to sputter and redistribute material in the opening. Typically, the voltages are below −50 V. The operating pressure of the chamber may be in a range of approximately 10–100 mTorr, and the fill gas may be an inert gas (e.g. argon, krypton, xenon, or the like). The coil and the target need not be the same material, but by way of example, both may be copper.

Figure 11:
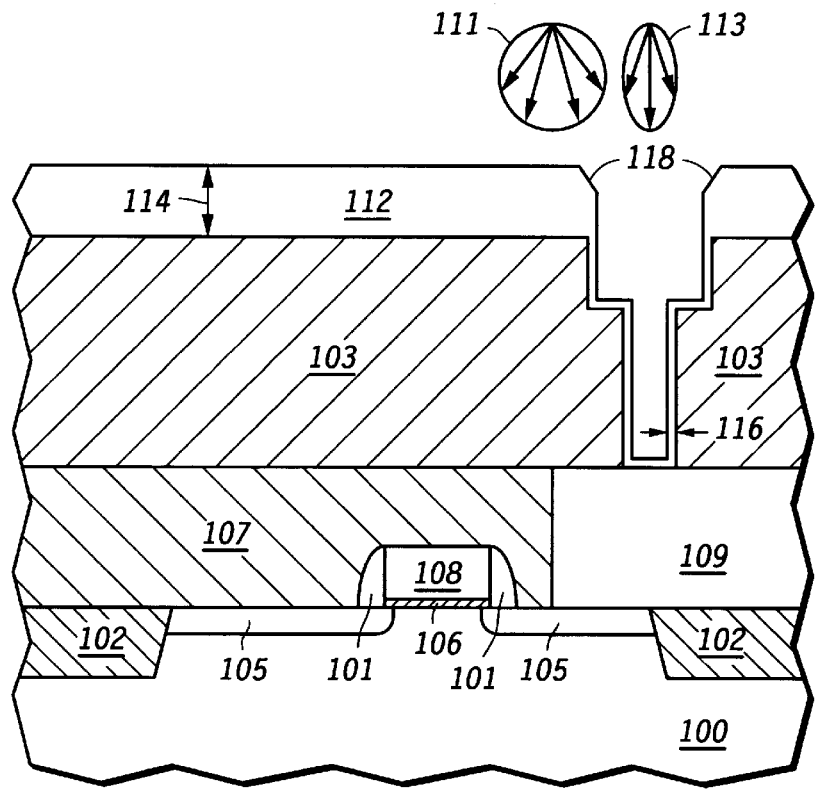

As illustrated in FIG. 11, ions 113 and neutrals 111 of the material being deposited are directed toward the surface. Because the ions 113 are accelerated, they generally are traveling substantially perpendicularly to the substrate surface but do have a velocity component parallel to the substrate surface. Unlike the ions 113, the neutrals 111 are not affected by an electrical field and have a wider distribution of angles when they hit the substrate. The deposition species generation region is characterized by a mass diffusion length. The region lies at least approximately one mass diffusion length away from the substrate 100. The film 112 is formed by this deposition. The film 112 is a layer including a refractory metal, such as titanium, tantalum, tungsten, any of their nitrides, and the like, or a layer including a conductive metal that are used for interconnects, such aluminum, copper, and the like.

On flat exposed surfaces, the film 112 has a thickness 114 that is in a range of approximately 100–500 nanometers. However, the ions can erode corners of layer 112 near opening 104 to form facets 118. Some of the material from facets 118 redeposits within either the via portion 1042 or within the interconnect trench 1044 of opening 104. In addition, ions and neutrals can directly impinge on sidewalls, either depositing or eroding material already deposited on the side wall, resulting in further redistribution of material in the trench or via. Some of the ions reach the bottom of deep trenches and may re-sputter or redeposit material from the trench or via bottom to sidewalls where coverage may be otherwise thin. This produces sidewall thickness 116 to be formed as shown in FIG. 11. In general, the thickness 116 is typically approximately 0.2–0.3 times the thickness of 114.

Across the substrate 100, thickness 114 of layer 112 near the edge of the substrate 100 can be at least twice as thick as the thickness 114 of layer 112 near the center of the substrate 100. By controlling the shape of the ionization region, the thickness profile (thickness of the film as a function of position along the substrate) can be tailored to whatever is needed for a particular application. In some applications, the thickness requirements for various process considerations can be different. For example, the film may need to be a little thicker near the edge to account for polishing non-uniformity if the layer is subsequently polished. In another application, preventing the formation of voids of conductive materials formed within the opening may be more important. In this application, a uniform thickness across the substrate may be desired. Those of ordinary skill in the art should adjust the shape and density of the deposited species generation region to achieve the thickness profile desired for their application.

Figure 12:
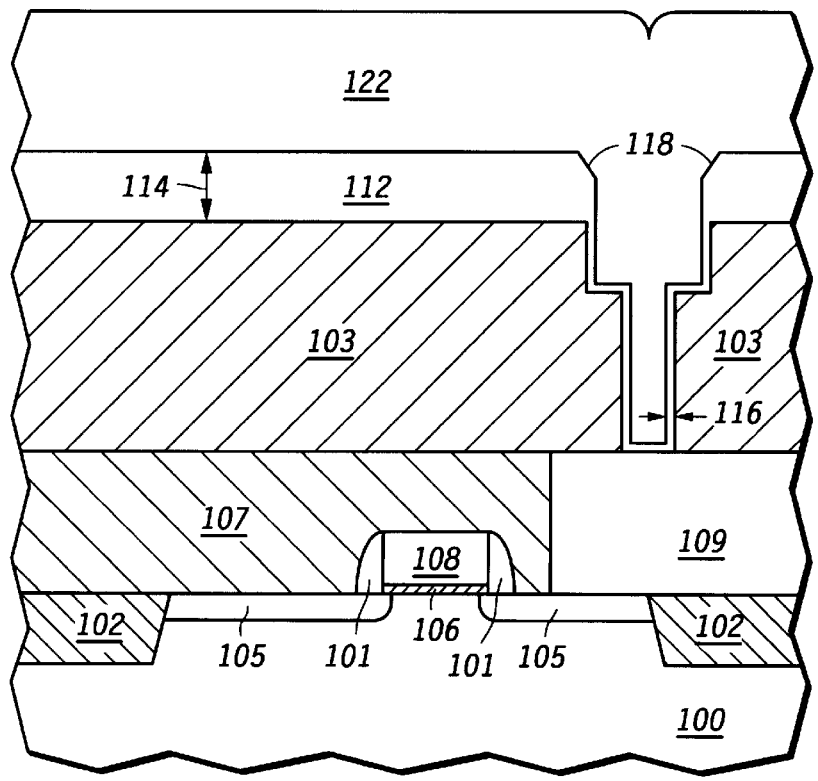

A conductive fill material 122 is then formed over the film 112 and completely fills in the rest of the opening 104 as shown in FIG. 12. The conductive fill material 122 typically includes tungsten, copper, aluminum or their alloys and can be formed by any deposition method including physical vapor deposition, electroplating, or the like. Typically, the thickness of the conductive fill material is in a range of approximately 500 to 1500 nanometers.

Figure 13:
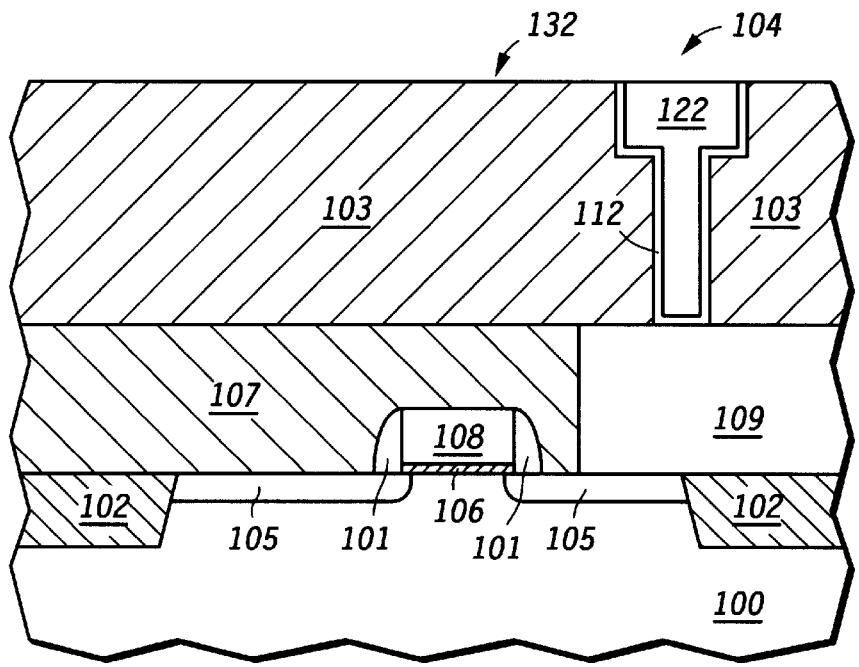

The substrate is then polished to give a planar surface 132 as illustrated in FIG. 13. This removes any portion of the conductive fill material 122 and the film 112 that overlies the second ILD layer 103. This forms a dual inlaid interconnect making contact to one of the doped regions 105.

Figure 14:
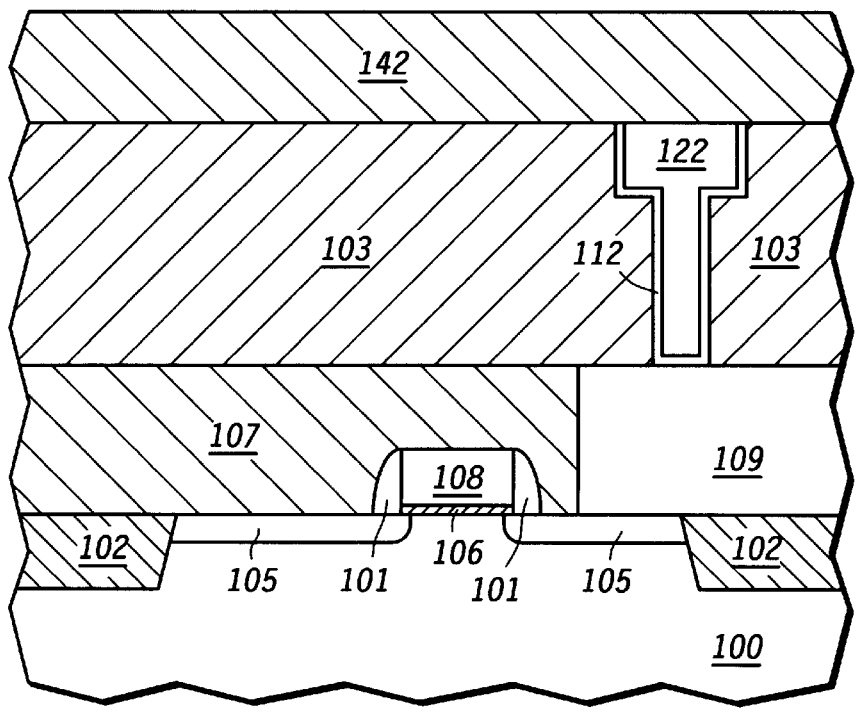

Processing continues to form the substantially completed device including a passivation layer 142 as illustrated in FIG. 14. Although not illustrated, other connections are made to the gate electrode 108 and the other doped region 105. Additionally, if other interconnect levels are required, additional layers are formed in the manner previously described.

The embodiments are quite useful for two situations typically seen in processing semiconductor device substrates. The first is for the high aspect ratio openings as illustrated in FIGS. 10–14. In this case the via portion 1042 has a height that is at least twice as large as the width near the bottom of the via portion 1044. When the aspect ratio becomes larger than 2:1, the deposition typically becomes much more difficult. Using the IMP-PVD methods alleviates this difficulty compared to conventional magnetron PVD sputtering systems. In one application, the IMP-PVD methods can be used in forming trench capacitors. Many times, the trenches (openings) have aspect ratios of 5:1 or even exceed 10:1. A first capacitor electrode, capacitor dielectric, and a second capacitor electrode can be formed within each of the trenches. Any or all of the first capacitor electrode, capacitor dielectric, and second capacitor electrode may be formed all or in part using the IMP-PVD methods previously described. Needless to say, the trench would not be completely fill with the first capacitor electrode or capacitor dielectric if a trench capacitor is being formed.

In another situation, the film thickness when forming the film 112 can be adjusted such that it is thicker near the edges of the substrate compared to the center. This may be relatively important if the film is to be polished because some chemical-mechanical polishing operations polish faster near the edge of the substrate compared to the center.

Another benefit in using the embodiments is that they do not require modification of process integration schemes. Most of the changes herein are changes to the mechanical set up of the equipment and how it operates. They do not require the addition of more masking or other processing steps to an existing process flow. Additionally, more process margin can be achieved, as the thickness across the wafer can be tailored to account for subsequent processing steps having nonuniform characteristics, like polishing.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

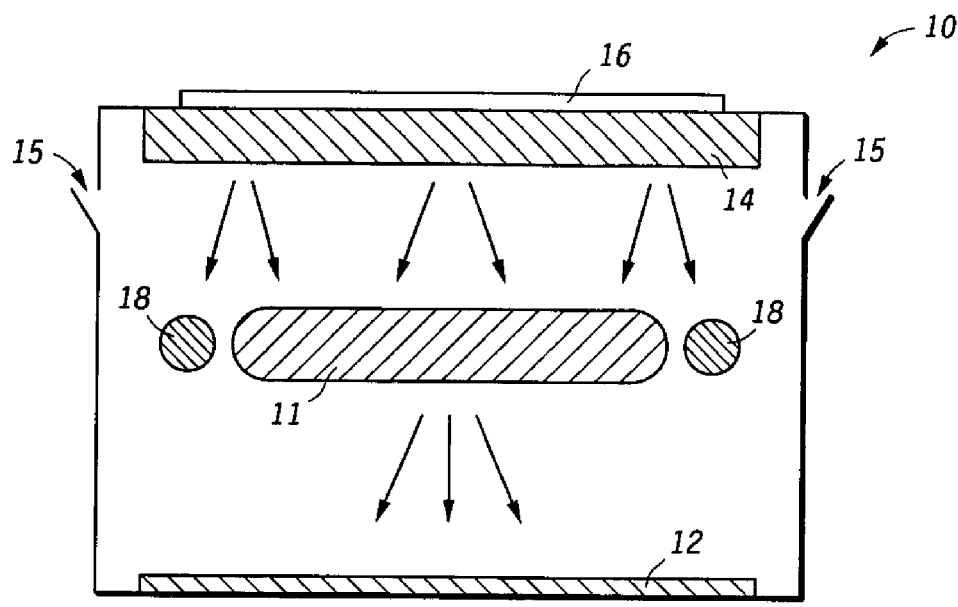
FIG.1
-PRIOR ART-
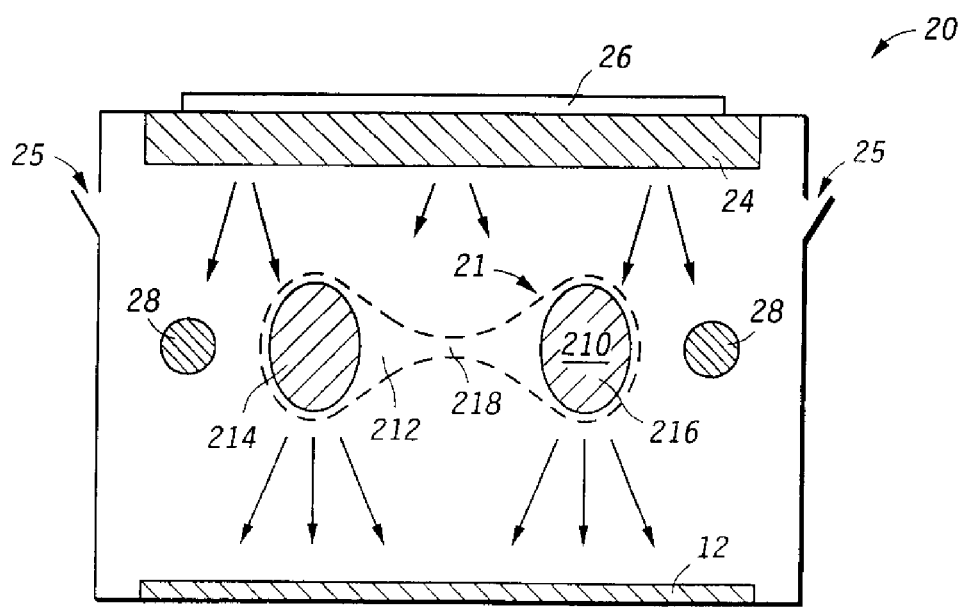

What is claimed is:

1. A process for forming a semiconductor device comprising:
   placing a substrate into a chamber of an ionized metal plasma physical vapor deposition system that generates metal ions in a deposition species generation region including a first region and a second region, wherein the chamber has a center; and
   providing a gas that includes a metal to form a layer over the substrate in the chamber, wherein:
   the metal ions are generated from the metal;
   the first region is spaced apart from the center and the second region lies closer to the center compared to the first region; and
   a density of the deposition species within the first region is significantly higher compared to the density of the species within the second region.

2. The process of claim 1, wherein the second region surrounds the center, and the first region surrounds the second region.

3. The process of claim 2, wherein the first region has an annular shape.

4. The process of claim 1, wherein the first and second regions are spaced apart from the substrate.

5. The process of claim 4, wherein:
   the deposition species generation region is characterized by a mass diffusion length; and
   the first and second regions lie at least approximately one mass diffusion length away from the substrate.

6. The process of claim 1, wherein forming a layer is performed such that:
   the substrate has a substrate center;
   the layer has a first thickness at a first location and second thickness at a second location, wherein:
   the first location is closer to the substrate center than the second location; and
   the second thickness is at least as thick as the first thickness.

7. The process of claim 1, wherein:
   the substrate includes an opening;
   the opening has a width near a bottom of the opening;
   the opening has a height that is at least twice as large at the width;
   a portion of the layer is formed within the opening and outside the opening; and
   a thickness of the layer along a side wall of the opening near the bottom is at least approximately 0.2 times a thickness of the layer lying outside the opening.

8. The process of claim 1, further comprising forming a passivation layer over the substrate after forming the layer.

9. A process for forming a semiconductor device comprising:
   placing a substrate into a chamber within an ionized metal plasma physical vapor deposition system that generates metal ions in a deposition species generation region; and
   forming a layer over the substrate in the chamber, wherein the chamber includes
   a gas distribution ring delivering a gas that includes a metal used to form the layer.

10. The process of claim 9, wherein:
    the gas distribution ring is concentric with the substrate, and
    the deposition species generation region is concentric with the gas distribution ring.

11. The process of claim 9, further comprising forming a passivation layer over the substrate after forming the layer over the substrate in the chamber.

12. A process for forming a semiconductor device comprising:
    placing a substrate having a substrate center into a chamber; and
    providing a metal-containing gas into the chamber; and
    ionizing the metal to form a layer over the substrate in the chamber using an ionized metal-containing precursor plasma wherein:
    the layer has a first thickness and a second thickness:
    the first thickness is closer to the center than the second thickness, and the second thickness is thicker than the first thickness.

13. A process for forming a semiconductor device comprising:
    placing a substrate into a chamber within an ionized metal plasma physical vapor deposition system that generates metal ions in a deposition species generation region; and
    forming a layer over the substrate in the chamber, wherein the chamber includes:
    a Faraday cage that occupies at least a portion of a space between a target and a center of the substrate, wherein the Faraday cage substantially prevents generation of an ionized metal species at the at least a portion of the space.

* * * * *

UNITED STATES PATENT AND TRADEMARK OFFICE
CERTIFICATE OF CORRECTION

PATENT NO. : 6,165,567
DATED : December 26, 2000
INVENTOR(S) : Peter L. G. Ventzek et al.

It is certified that error appears in the above-identified patent and that said Letters Patent is hereby corrected as shown below:

Drawings,
Figure 2 was printed as both Figure 1 and Figure 2. Sheet 1 of 7 is attached showing the correct drawings for Figures 1 and 2.

Signed and Sealed this

Twelfth Day of April, 2005

JON W. DUDAS
*Director of the United States Patent and Trademark Office*